United States Patent [19]
Kim

[11] Patent Number: 5,780,914
[45] Date of Patent: Jul. 14, 1998

[54] CONTACT IMAGE SENSOR WHOSE SENSORY ELEMENTS HAVE IDENTICAL OUTPUT LEVELS

[75] Inventor: Yo-Joung Kim, Seoul, Rep. of Korea

[73] Assignee: Samsung Electronics Co., Ltd., Kyungki-do, Rep. of Korea

[21] Appl. No.: 752,170

[22] Filed: Nov. 18, 1996

[30] Foreign Application Priority Data

Nov. 17, 1995 [KR] Rep. of Korea .................. 1995-41881

[51] Int. Cl.$^6$ ................................ H01L 31/0232
[52] U.S. Cl. .................. 257/435; 257/443; 257/223; 257/229
[58] Field of Search .................... 257/222, 223, 257/229, 435, 443

[56] References Cited

U.S. PATENT DOCUMENTS 4,841,348  6/1989  Shizukuishi et al. .................. 257/435
5,276,349  1/1994  Takahara .................. 257/435

*Primary Examiner*—Minh-Loan Tran
*Attorney, Agent, or Firm*—Sughrue, Mion, Zinn, Macpeak & Seas, PLLC

[57] ABSTRACT

A contact image sensor whose sensory elements have similar output levels is disclosed. The sensor includes: a first region consisting of a plurality of light sensory elements situated on a silicon wafer, the light sensory elements being separated from one another by an isolation material; an implanted region formed in the silicon wafer under the first region for preventing carrier from affecting the silicon wafer; a plurality of circuitry regions formed on a portion of the silicon wafer excluding the first region, the circuitry regions being separated from one another; and a light shielding region formed on the silicon wafer between the first region and the plurality of circuitry regions.

4 Claims, 2 Drawing Sheets

CONTACT IMAGE SENSOR WHOSE SENSORY ELEMENTS HAVE IDENTICAL OUTPUT LEVELS

BACKGROUND OF THE INVENTION

1. Field of the Invention

The present invention relates to a contact image sensor of a data recognition device of a facsimile, and more particularly, to a contact image sensor whose sensory elements have identical output levels.

The present application for contact image sensor, is based on Korean Application No. 41881/1995 which is incorporated herein by reference for all purposes.

2. Description of the Related Art

Generally, a contact image sensor (CIS), which is part of a data recognition device of a facsimile, consists of a light sensory element (photo diode) implemented by bipolar transistors and a flip flop for generating a clock, which are manufactured using conventional methods. Since tens of bipolar transistors are used to form the light sensory element, an ideal contact image sensor requires that the output levels of the bipolar transistors be identical. However, the output levels of the bipolar transistors are affected by inherent defects and impurities in the wafer and the peripheral circuits. The effects of the defects and impurities are especially noticeable when the sensor is exposed to light during normal service. While one may use an epitaxial wafer in order to eliminate or reduce defects and impurities, the production costs of an epitaxial wafer is prohibitively expensive.

FIG. 1 is a plan view of a conventional contact image sensor, and FIG. 2 is a cross-sectional view of FIG. 1. Referring to FIGS. 1 and 2, the conventional contact image sensor is divided into two regions: a light sensory region 22, including a plurality of arrays of bipolar transistors 2 formed on a silicon wafer, and a peripheral circuit region 6, including a plurality of shift transistor array 8 and flip flop array 9 arranged close to the light sensory region 22. In this case, the substrate is a conventional silicon wafer, not an epitaxial silicon wafer.

As shown in the drawings, since the light sensory region 22 and the peripheral circuit region 6 are not separated from each other, light sensory region 22 affects peripheral circuit region 6. Accordingly, silicon wafer 20 excluding peripheral circuit region 6 is directly exposed to a light source, facilitating the production of carriers 12. This increases the current amplification of a neighboring light sensory element 2, that is, one of bipolar transistors 2. This makes the output levels of the bipolar transistors 2 different from one another, resulting in deterioration of the performance of the contact image sensor.

SUMMARY OF THE INVENTION

An object of the present invention is to provide a contact image sensor whose light sensory elements have identical output levels.

Another object of the present invention is to provide a contact image sensor capable of preventing carriers from being generated in the silicon wafer.

A further object is to provide a contact image sensor capable of preventing carriers from being produced in the silicon wafer 20, or producing only a fixed amount of carriers.

To accomplish the objects of the present invention, there is provided a contact image sensor whose light sensory elements have identical output levels. The CIS includes a first region (bipolar transistor) having a plurality of light sensory element arrays situated on a silicon wafer. The light sensory elements are separated from one another by a light shielding layer. A second region (channel stop region) is formed in the silicon wafer, the second region being placed under the first region, the second region preventing carriers from transferring to the silicon wafer. A plurality of third regions (peripheral circuit region) are formed on a top surface of selected portion in the silicon wafer, excluding the first and second regions. The plurality of third regions is separated from one another, and a fourth region (light shielding layer) is formed on the silicon wafer. The fourth region being formed between the plurality of first and third regions and is exposed to a light source.

DETAILED DESCRIPTION OF THE PREFERRED EMBODIMENT

With reference to the attached drawings, the preferred embodiment of the invention will be described in detail.

Figure 1:
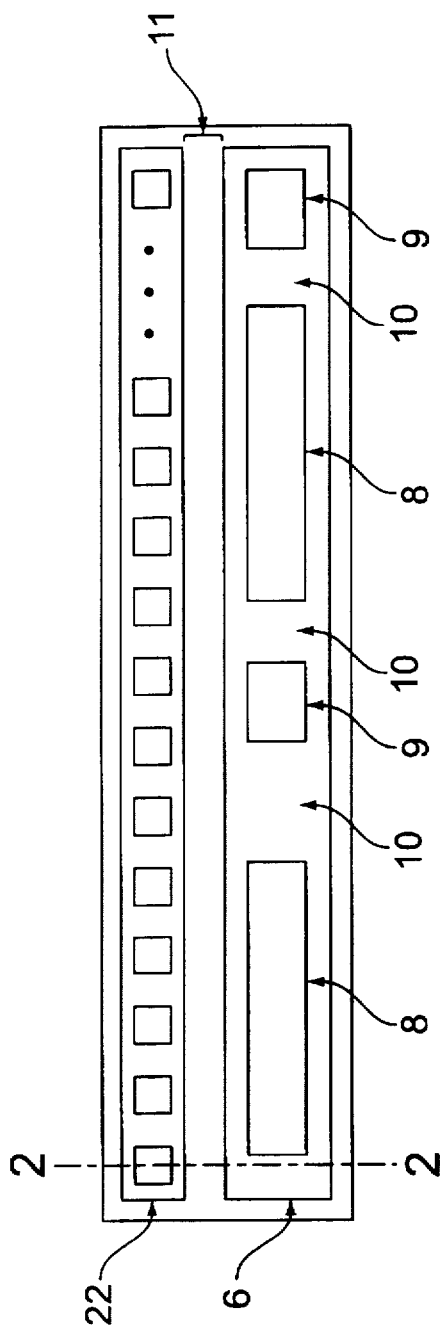
FIG. 1 is a plan view of a conventional contact image sensor.
Figure 2:
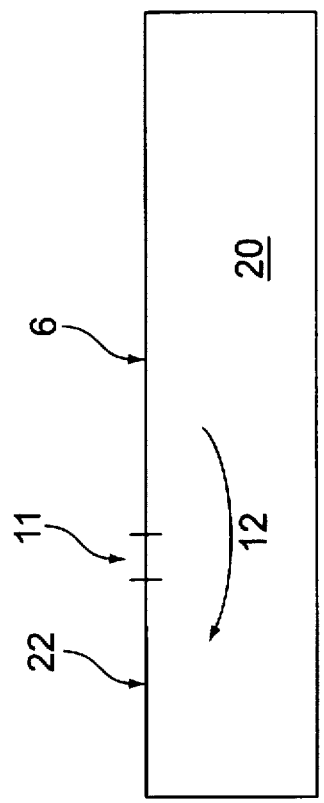
FIG. 2 is a cross-sectional view of the conventional contact image sensor.
Figure 3:
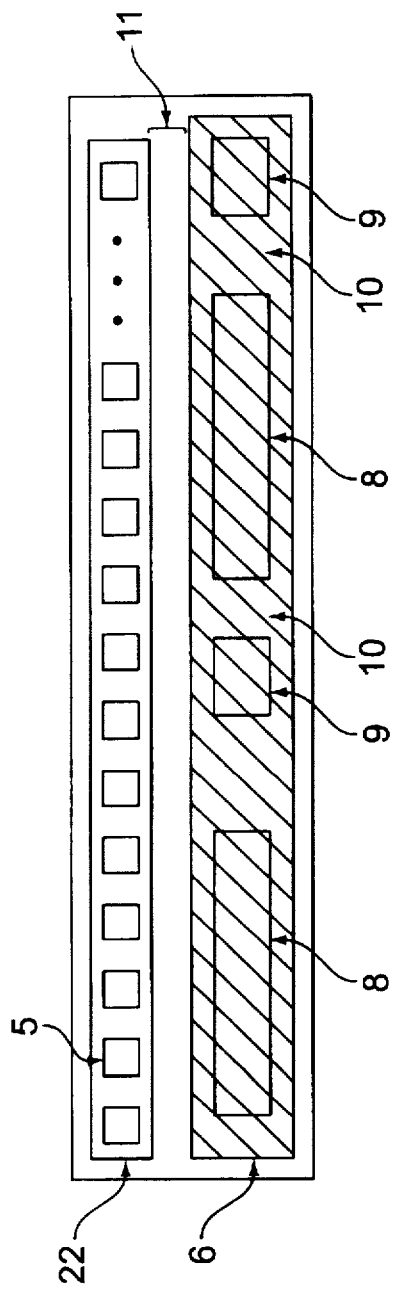
FIG. 3 is a plan view of a contact image sensor according to the present invention.
Figure 4:
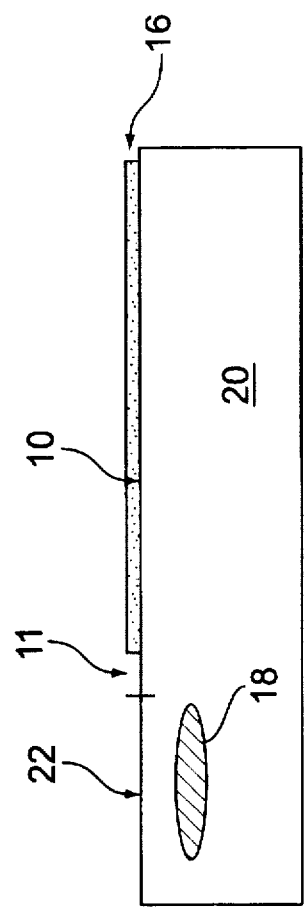
FIG. 4 is a cross-sectional view of the contact image sensor according to the present invention.

FIG. 3 is a plan view of a contact image sensor according to the present invention, and FIG. 4 is a cross-sectional view of FIG. 3. Referring to FIGS. 3 and 4, the contact image sensor of the present invention is constructed with a light sensory region 22 formed in a manner that a plurality of light sensory elements (bipolar transistor) 5 are formed on top surface of a portion in silicon wafer 20. An ion-implanted region 18 is formed in a given portion located under light sensory region 22 in wafer 20. Upon exposure to a light source, carriers are produced in the silicon wafer 20 under exposed light region 10 and light sensory element 5. The ion implanted region 18 is provided for preventing the produced carriers in the region under peripheral circuit region 6 from transferring to the light sensory region 22.

A light shielding layer 16 is formed on a top portion of the peripheral circuit region 6. The light shielding region 16 is for separating and covering (shielding) the peripheral circuit region 6, so as to even-out the output level of the light sensory region 22. The light shielding region 16, can be made of materials such as Al, Cr, SiNx, and should have low transmissivity and low surface reflectivity.

Peripheral circuit region 6 includes peripheral circuits shift transistors 9, flip flops, and the exposed light region 10, formed on the silicon wafer 20. Separation region 11 is provided between the light sensory region 22 and the light shielding layer 16. The separation region 11 is provided to prevent electrical shorting between the light sensory region 22 and the peripheral circuit region 6. Separation region 11 also helps reduce the carriers produced in the peripheral circuit region 6.

As shown in FIG. 4, a selected portion of the silicon wafer 20 is covered with the light shielding layer 16 in order to shield region 10 from exposure to light. The light shielding layer 16 is formed on a top portion of the exposed region 10. Thus, the light shielding layer 16 effectively covers the peripheral circuit region 6, but does not cover the light sensory region 22. Region 10 is exposed to the light source but does not by itself shield the surface of the wafer 20 from the light source.

The ion implanted region (channel stop region) 18 is formed under the light sensory region 22, in a selected portion of wafer 20, for the purpose of preventing the production of carriers under the exposed light region 10 and separation region 11, and for maintaining even amount of identical carriers.

It should be understood that the present invention is not limited to the particular embodiment disclosed herein as the best mode contemplated for carrying out the present invention, but rather that the present invention is defined in the appended claims.

What is claimed is:

1. A contact image sensor comprising:

a light sensory region having a light sensory element formed on a silicon wafer;

a peripheral circuit region having a plurality of shift transistors and flip flops formed on a top portion of said silicon wafer excluding said light sensory region;

a light shielding layer formed on the peripheral circuit and an exposed light region formed on said silicon wafer, said light shielding layer provided for preventing carriers from transferring to the light sensory region; and an ion implanted region disposed under said light sensory region to prevent carriers from transferring to said light sensory region in said silicon wafer.

2. The contact image sensor as claimed in claim 1, wherein said light shielding layer has a low transmissivity and low reflectivity.

3. A contact image sensor comprising:

a light sensory region having a light sensory element formed on a silicon wafer;

a peripheral circuit region including a shift transistor and a flip flop formed on a portion of said silicon wafer excluding said light sensory region;

an ion implanted region formed under said light sensory region;

carriers formed in the silicon wafer;

a separating region disposed between the light sensory region and peripheral region to reduce the carriers produced from said peripheral circuit region and preventing electrical shorting between the light sensory region and the peripheral circuit region; and a light shielding layer formed on the peripheral circuit region and an exposed light region formed on said silicon wafer, and said light shielding layer for preventing carriers from transferring to the light sensory region.

4. A contact image sensor whose sensory elements have identical output levels, said contact image sensor comprising:

a silicon wafer;

a plurality of light sensory elements disposed on a first region of the silicon wafer;

a peripheral circuit region formed on a portion of said silicon wafer, said light sensory elements being separated from the peripheral circuit region;

carriers formed in the silicon wafer;

an ion implanted region formed in said silicon wafer, said ion implanted region being disposed under said first region to prevent carriers from transferring to said first region in said silicon wafer;

a light shielding layer formed on the peripheral circuit region and an exposed light region formed on said silicon wafer, and light shielding layer for preventing carriers from transferring to said first region.

* * * * *